United States Patent
Nie

(10) Patent No.: US 10,763,788 B2
(45) Date of Patent: Sep. 1, 2020

(54) METHOD AND DEVICE FOR FSK/GFSK DEMODULATION

(71) Applicant: TELINK SEMICONDUCTOR (SHANGHAI) CO., LTD., Shanghai (CN)

(72) Inventor: Hong Nie, Shanghai (CN)

(73) Assignee: TELINK SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/559,961

(22) Filed: Sep. 4, 2019

(65) Prior Publication Data

US 2020/0076370 A1 Mar. 5, 2020

(30) Foreign Application Priority Data

Sep. 4, 2018 (CN) .......................... 2018 1 1024709

(51) Int. Cl.
*H03D 3/00* (2006.01)
*H03D 3/02* (2006.01)
*H04L 27/144* (2006.01)

(52) U.S. Cl.
CPC .............. *H03D 3/02* (2013.01); *H04L 27/144* (2013.01)

(58) Field of Classification Search
CPC ......... H03D 3/02; H04L 27/144; H04L 27/14; H04L 27/2338; H04L 27/2017

(Continued)

(56) References Cited

U.S. PATENT DOCUMENTS

2011/0170583 A1* 7/2011 Polaert ................ H04L 7/0054
375/224

OTHER PUBLICATIONS

Extended European Search Report dated Jan. 27, 2020 in European Application No. 19195346.2, 7 pages.

(Continued)

*Primary Examiner* — Richard Tan
(74) *Attorney, Agent, or Firm* — Nixon & Vanderhye P.C.

(57) ABSTRACT

The present invention relates to communication technologies and provides a method and a device for FSK/GFSK demodulation, the method comprises: determining a digital information vector group $\{V_l(i)\}$ of a codeword a[k] to be demodulated and a corresponding phase matching vector group $\{\theta_l(i)\}$ within the duration of (2M+1)T; determining a received phase vector $\bar{\varphi}(i)$ of a received FSK/GFSK baseband signal $\varphi(t,a)$; determining an average phase difference $\beta_l$ between $\bar{\varphi}(i)$ and $\theta_l(i)$; calculating the phase matching degree $Q_l$ between $\bar{\varphi}(i)$ and $\theta_l(i)$ after removing the impact of the average phase difference $\beta_l$, and determining an l value corresponding to the phase matching degree $Q_l$ being the maximum; and determining the a[k], corresponding to the l value, in the digital information vector $V_l(i)$ as a demodulation result. Because the impact of the average phase difference is removed during phase matching, the accuracy of phase matching is increased, and the performance of the phase domain demodulation technology is improved.

12 Claims, 2 Drawing Sheets

(58) Field of Classification Search
USPC .......................................................... 329/315
See application file for complete search history.

(56) References Cited

OTHER PUBLICATIONS

Jinjin He et al., "A Low-Complexity High-Performance Noncoherent Received for GFSK Signals," Circuits and Systems, 2008, ISCAS 2008, IEEE International Symposium on IEEE, XP031392208, DOI: 10.1109/ISCAS.2008.4541653, ISBN: 978-1-4244-1683-7, May 18, 2008, pp. 1256-1259.

Charles Tibenderanna, "A High-Performance, Efficient, and Reliable Receiver for Bluetooth Signal," University of Southampton Faculty of Engineering and Applied Science Department of Electronics and Computer Science, Jan. 1, 2005, XP055658866, Retrieved from the Internet: URL: https://theses.eurasip.org/media/theses/documents/tibenderana-charles-a-high-performance-effiecient-and-reliable-receiver-for-bluetooth-signals.pdf, 156 pages.

* cited by examiner

METHOD AND DEVICE FOR FSK/GFSK DEMODULATION

CROSS-REFERENCE TO RELATED PATENT APPLICATION

This application claims the benefit of and priority to Chinese Patent Application No. 201811024709.X filed on Sep. 4, 2018, the entire disclosure of which is incorporated by reference herein.

FIELD OF THE INVENTION

The present invention relates to the field of data processing, and in particular, to a method and a device for FSK/GFSK demodulation.

BACKGROUND OF THE INVENTION

The existing matching filter group-based method for FSK/GFSK demodulation mainly accomplishes a demodulation operation in a complex domain (i.e. I\Q plane), which requires a large number of complex multiplication, complex addition and complex subtraction operations, resulting in a system with high complexity.

Since an FSK/GFSK signal has a constant envelope, if the digital information transmitted is all contained in the phase of the signal and the demodulation operation is accomplished in the phase domain, a large number of complex operations could be converted into real addition and subtraction operations, and thus system complexity may be effectively lowered.

However, the inventors find that the existing phase domain demodulation technology does not employ a phase matching filter group (i.e., the phase matching vector group in the invention) for the demodulation operation, or there exist technical defects in employing a phase matching vector group, so that the performance of the existing phase domain demodulation technology is much lower than that of the complex domain demodulation technology.

SUMMARY OF THE INVENTION

As directed to the above mentioned problem of low performance of the phase domain demodulation technology, the present invention is directed to a method and a device for FSK/GFSK demodulation, thereby improving the performance of the phase domain demodulation technology.

According to the first aspect of the invention, there provides a method for FSK/GFSK demodulation, which includes:

determining a digital information vector group $\{V_l(t)\}$ of a codeword a[k] to be demodulated and a corresponding phase matching vector group $\{\theta_l(i)\}$ within a duration of $(2M+1)T$, wherein M is an integer and $M \geq 1$, l is a phase matching vector number, and i is a sampling point number;

determining a received phase vector $\tilde{\varphi}(i)$ of a received FSK/GFSK baseband signal $\varphi(t,a)$;

determining an average phase difference $\beta_l$ between $\tilde{\varphi}(i)$ and $\theta_l(i)$;

calculating a phase matching degree $Q_l$ between $\tilde{\varphi}(i)$ and $\theta_l(l)$ after removing the impact of the average phase difference $\beta_l$, and determining an l value corresponding to the phase matching degree $Q_l$ being the maximum; and determining the a[k], corresponding to the l value, in the digital information vector $V_l(i)$ as a demodulation result.

Moreover, the calculating a phase matching degree $Q_l$ between $\tilde{\varphi}(i)$ and $\theta_l(i)$ after removing the impact of the average phase difference $\beta_l$ and determining an l value corresponding to the phase matching degree $Q_l$ being the maximum specifically includes:

determining the phase matching degree as $Q_l = \Sigma_{i=1}^{(2M+1)N} f[\tilde{\varphi}(i) - \theta_l(i) - \beta_l]$, wherein N is the sampling times within time T, and $f[x]$ is a function for phase matching degree measurement; and determining an l value corresponding to the phase matching degree $Q_l$ being the maximum.

Further, the $f[x]$ specifically is:

$$f[x] = \cos(x); \text{ or}$$

$$f[x] = \begin{cases} \cos(x), & |x| < \pi \\ 1, & |x| \geq \pi \end{cases}; \text{ or}$$

$$f[x] = \begin{cases} -x^2, & |x| < C \\ -C^2, & |x| \geq C \end{cases},$$

wherein C is a given constant; or $$f[x] = \begin{cases} -|x|, & |x| < C \\ -C, & |x| \geq C \end{cases},$$

wherein C is a given constant.

Further, during determining the phase matching degree between $\tilde{\varphi}(i)$ and $\theta_l(i)$, for a[k−M], a[k−M+1], . . . , a[k−1] with known demodulation results, only the $\theta_l(i)$ corresponding to the known demodulation results are employed for phase matching with the $\tilde{\varphi}(i)$.

Moreover, the determining a digital information vector group $\{V_l(i)\}$ of a codeword a[k] to be demodulated and a corresponding phase matching vector group $\{\theta_l(i)\}$ within a duration of $(2M+1)T$ specifically includes:

for 2FSK/2GFSK, taking a[1], a[2], . . . , a[2M], a[2M+1] as 1 or −1 respectively, generating $2^{2M+1}$ digital information vectors $V_l(i)$, $l=1, 2, \ldots, 2^{2M+1}$, and substituting each digital information vector into $\theta(t,a) = 2\pi h \Sigma_{k=-\infty}^{\infty} a[k]q(t-kT)$, and then sampling $\theta(t,a)$ by taking $t=iT/N$, $i=1, 2, \ldots, (2M+1)N$ to generate $2^{2M+1}$ phase matching vectors $\theta_l(t)$, wherein $q(t)$ is the phase change of the FSK/GFSK baseband signal caused by each digital information over time;

for 4FSK/4GFSK, taking a[1], a[2], . . . , a[2M], a[2M+1] as 3, 1, −1 or −3 respectively, generating $4^{2M+1}$ digital information vectors $V_l(i)$, $l=1, 2, \ldots, 4^{2M+1}$, and substituting each digital information vector into $\theta(t,a) = 2\pi h \Sigma_{k=-\infty}^{\infty} a[k]q(t-kT)$, and then sampling $\theta(t,a)$ to by taking $t=iT/N$, $i=1, 2, \ldots, (2M+1)N$ to generate $4^{2M+1}$ phase matching vectors $\theta_l(i)$ wherein $q(t)$ is the phase change of the FSK/GFSK baseband signal caused by each digital information over time.

Moreover, the determining an average phase difference $\beta_l$ between $\tilde{\varphi}(i)$ and $\theta_l(i)$ specifically includes:

determining the average phase difference between $\tilde{\varphi}(i)$ and $\theta_l(i)$ as $$\beta_l = \frac{1}{(2M+1)N} \sum_{i=1}^{(2N+1)N} \tilde{\varphi}(i) - \theta_l(i).$$

According to a second aspect of the invention, there provides a device for FSK/GFSK demodulation, which includes:

a phase matching vector group determination unit, configured to determine a digital information vector group $\{V_l(i)\}$ of a codeword a[k] to be demodulated and a corresponding phase matching vector group $\{\theta_l(i)\}$ within a duration of $(2M+1)T$, wherein M is an integer and $M \geq 1$, l is a phase matching vector number, and i is a sampling point number;

a received phase vector determination unit, configured to determine a received phase vector $\tilde{\varphi}(i)$ of a received FSK/GFSK baseband signal $\varphi(t,a)$;

an average phase difference determination unit, configured to determine an average phase difference between $\tilde{\varphi}(t)$ and $\theta_l(i)$;

a matching unit, configured to calculate a phase matching degree $Q_l$ between $\tilde{\varphi}(i)$ and $\theta_l(i)$ after removing the impact of the average phase difference $\beta_l$, and determine an l value corresponding to the phase matching degree $Q_l$ being the maximum; and a demodulation result determination unit, configured to determine the a[k], corresponding to the l value, in the digital information vector $V_l(i)$ as a demodulation result.

Moreover, the matching unit is specifically configured to:

determine the phase matching degree as $Q_l = \sum_{i=1}^{(2M+1)N} f[\tilde{\varphi}(i) - \theta_l(i) - \beta_l]$, wherein N is the sampling times within time T, and $f[x]$ is a function for phase matching degree measurement; and determine an l value corresponding to the phase matching degree $Q_l$ being the maximum.

Further, the $f[x]$ specifically is:

$$f[x] = \cos(x); \text{ or}$$

$$f[x] = \begin{cases} \cos(x), & |x| < \pi \\ 1, & |x| \geq \pi \end{cases}; \text{ or}$$

$$f[x] = \begin{cases} -x^2, & |x| < C \\ -C^2, & |x| \geq C \end{cases},$$

wherein C is a given constant; or $$f[x] = \begin{cases} -|x|, & |x| < C \\ -C, & |x| \geq C \end{cases},$$

wherein C is a given constant.

Further, when the matching unit calculates the phase matching degree $Q_l$ between $\tilde{\varphi}(i)$ and $\theta_l(i)$ for $a[k-M]$, $a[k-M+1], \ldots, a[k-1]$ with known demodulation results, only the $\theta_l(i)$ corresponding to the known demodulation results are employed for phase matching with the $\tilde{\varphi}(i)$.

Moreover, the phase matching vector group determination unit is specifically configured to:

for 2FSK/2GFSK, take $a[1], a[2], \ldots, a[2M], a[2M+1]$ as 1 or −1 respectively, generate $2^{2M+1}$ digital information vectors $V_l(i)$, $l=1, 2, \ldots, 2^{2M+1}$, and substitute each digital information vector into $\theta(t,a)=2\pi h \sum_{k=-\infty}^{\infty} a[k]q(t-kT)$, and then sample $\theta(t,a)$ by taking $t=iT/N$, $i=1, 2, \ldots, (2M+1)N$ to generate $2^{2M+1}$ phase matching vectors $\theta_l(i)$, wherein q(t) is the phase change of the FSK/GFSK baseband signal caused by each digital information over time;

for 4FSK/4GFSK, take $a[1], a[2], \ldots, a[2M], a[2M+1]$ as 3, 1, −1 or −3 respectively, generate $4^{2M+1}$ digital information vectors $V_l(i)$, $l=1, 2, \ldots, 4^{2M+1}$, and substitute each digital information vector into $\theta(t,a)=2\pi h \sum_{k=-\infty}^{\infty} a[k]q(t-kT)$, and then sample $\theta(t,a)$ by taking $t=iT/N$, $i=1, 2, \ldots, (2M+1)N$ to generate $4^{2M+1}$ phase matching vectors $\theta_l(i)$, wherein q(t) is the phase change of the FSK/GFSK baseband signal caused by each digital information over time.

Moreover, the average phase difference determination unit is specifically configured to:

Determining the average phase difference between $\tilde{\varphi}(i)$ and $\theta_l(i)$ as $$\beta_l = \frac{1}{(2M+1)N} \sum_{i=1}^{(2M+1)N} \tilde{\varphi}(i) - \theta_l(i).$$

In the method and the device for FSK/GFSK demodulation according to the embodiments of the invention, a digital information vector group $\{V_l(i)\}$ of a codeword a[k] to be demodulated and a corresponding phase matching vector group $\{\theta_l(i)\}$ are determined within a duration of $(2M+1)T$, and after a received phase vector $\tilde{\varphi}(i)$ of a received FSK/GFSK baseband signal $\tilde{\varphi}(t,a)$ is determined, an average phase difference $\beta_l$ between $\tilde{\varphi}(i)$ and $\theta_l(i)$ further needs to be determined, and a phase matching degree $Q_l$ between $\tilde{\varphi}(i)$ and $\theta_l(i)$ is calculated after removing the impact of the average phase difference $\beta_l$, and an l value corresponding to the phase matching degree $Q_l$ being the maximum is determined, thereby the a[k], corresponding to the l value, in the digital information vector $V_l(i)$ is determined as a demodulation result. Because the impact of the average phase difference is removed during phase matching, the accuracy of phase matching may be increased, and the performance of the phase domain demodulation technology may be improved.

It should be understood that, the above description only shows a summary of the technical solutions of the invention for better understanding the technical measures of the invention so as to implement the invention according to the contents of the disclosure. In order to make the above and other objects, characteristics and advantages of the invention more apparent, specific embodiments of the invention will be illustrated below by examples.

BRIEF DESCRIPTION OF THE DRAWINGS

By reading the detailed description of the exemplary embodiments below, one of ordinary skills in the art will understand the above described and other advantages and benefits of the invention. The drawings are only provided for exhibiting exemplary embodiments, rather than limiting the invention. Throughout the drawings, the same labels are employed to indicate the same parts. In the drawings.

DETAILED DESCRIPTION OF THE EMBODIMENTS

Figure 1:
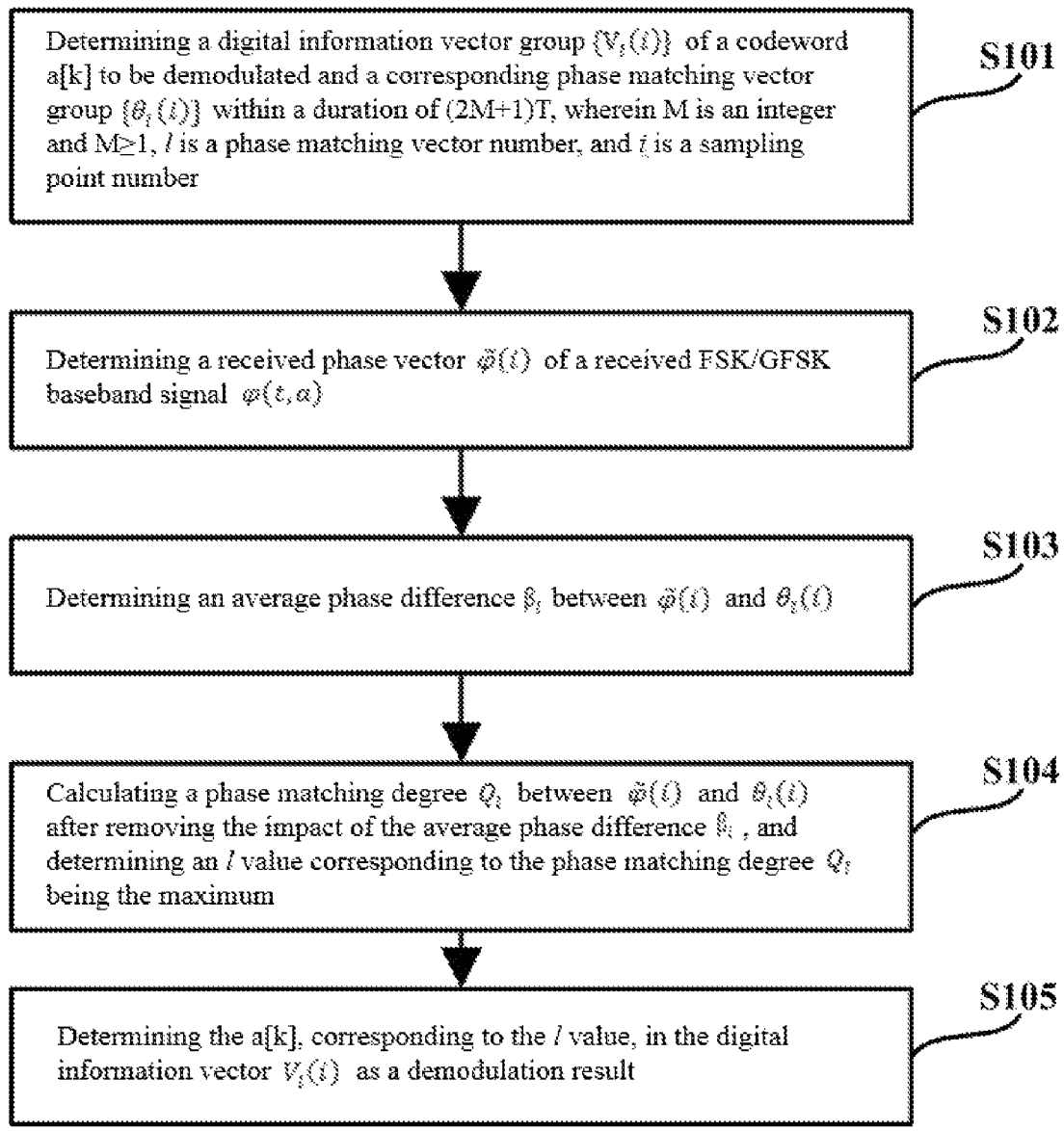
FIG. 1 is a flow chart of a method for FSK/GFSK demodulation according to an embodiment of the invention.

Exemplary embodiments of the present invention will be described in detail below in conjunction with the drawings.

Although exemplary embodiments of the invention are shown in the drawings, it should be understood that the invention may be implemented in various forms, rather than being limited to the embodiments illustrated herein. On the contrary, these embodiments are provided for more thoroughly understanding the invention and more fully convey the scope of the invention to those skilled in the art.

In the invention, it should be understood that, terms such as "include" or "comprise", etc., indicate the existence of the characteristics, figures, steps, actions, components and parts disclosed in the invention or combinations thereof, without excluding the existence of one or more other characteristics, figures, steps, actions, components, parts or combinations thereof.

Additionally, it should be further noted that, the embodiments of the invention and the characteristics in the embodiments may be combined to each other in the case of no conflict. The invention will be illustrated in detail below referring to the drawings and in conjunction with the embodiments.

As shown in FIG. 1, a method for FSK/GFSK demodulation according to an embodiment of the invention includes:

Step S101: a digital information vector group $\{V_i(i)\}$ of a codeword a[k] to be demodulated and a corresponding phase matching vector group $\{\theta_i(i)\}$ are determined, wherein M is an integer and M≥1, l is a phase matching vector number, and i is a sampling point number;

Step S102: a received phase vector $\tilde{\varphi}(i)$ of a received FSK/GFSK baseband signal $\varphi(t,a)$ is determined;

Step S103: an average phase difference $\beta_l$ between $\tilde{\varphi}(i)$ and $\theta_l(i)$ is determine;

Step S104: a phase matching degree $Q_l$ between $\tilde{\varphi}(i)$ and $\theta_l(i)$ is calculated after removing the impact of the average phase difference $\beta_l$, and an l value corresponding to the phase matching degree $Q_l$ being the maximum is determined; and Step S105: the a[k], corresponding to the l value, in the digital information vector $V_l(i)$ is determined as a demodulation result.

Because the impact of the average phase difference is removed during phase matching, the accuracy of phase matching may be increased, and the performance of the phase domain demodulation technology may be improved.

Since a large number of complex multiplication, addition and subtraction operations are converted into real addition and subtraction operations during the phase domain demodulation of an FSK/GFSK signal, the system complexity of demodulation is greatly lowered; moreover, a phase matching vector group is employed for demodulation, and the adverse impact of the average phase difference on phase matching is eliminated before demodulation, thus the accuracy of phase matching may be increased, and the performance of the phase domain demodulation technology may be improved.

Moreover, Step S104: a phase matching degree $Q_l$ between $\tilde{\varphi}(i)$ and $\theta_l(i)$ is calculated after removing the impact of the average phase difference $\beta_l$, and an l value corresponding to the phase matching degree $Q_l$ being the maximum is determined, specifically includes:

the phase matching degree is determined as $Q_l = \sum_{i=1}^{(2M+1)N} f[\tilde{\varphi}(i) - \theta_l(i) - \beta_l]$, wherein N is the sampling times within time T, and $f[x]$ is a function for phase matching degree measurement; and an l value corresponding to the phase matching degree $Q_l$ being the maximum is determined.

By determining the phase matching degree via $Q_l = \sum_{i=1}^{(2M+1)N} f[\tilde{\varphi}(i) - \theta_l(i) - \beta_l]$, the impact of the average phase difference may be well removed, so that the accuracy of phase matching may be improved.

The average phase difference between $\tilde{\varphi}(i)$ and $\theta_l(i)$ may be determined via $$\beta_l = \frac{1}{(2M+1)N} \sum_{i=1}^{(2N+1)N} \tilde{\varphi}(i) - \theta_l(i).$$

N is the sampling times within time T. The larger N is, the greater the sampling times in one period T will be, the better the performance will be, and the higher the complexity will be. The value of N may be set by one skilled in the art as required.

When $f[x]$ is a common function such as $f[x]=-x^2$ or $f[x]=-|x|$, the demodulation performance will be moderate, especially in the case of low signal-to-noise ratio. Therefore, in the embodiments of the invention, it is further determined via theoretical analysis according to the calculation method of euclidean distance in complex domain that an excellent demodulation performance can be obtained when the following four functions are employed as $f[x]$:

Function 1: $f[x]=\cos(x)$, this function is a function for phase matching degree measurement derived according to the calculation method of euclidean distance in complex domain;

$$f[x] = \begin{cases} \cos(x), & |x| < \pi \\ 1, & |x| \geq \pi \end{cases}, \quad \text{Function 2}$$

this function is a modification of Function 1, and it can eliminate the performance degradation caused by the reason that $\cos(x)$ is a periodic function when $|x| \leq \pi$;

$$f[x] = \begin{cases} -x^2, & |x| < C \\ -C^2, & |x| \geq C \end{cases}, \quad \text{Function 3}$$

wherein C is a given constant, this function is a simplification of Function 2, and it can lower the system complexity by eliminating the $\cos(x)$ operation, and the recommended value of C is $\pi$.

$$f[x] = \begin{cases} -|x|, & |x| < C \\ -C, & |x| \geq C \end{cases}, \quad \text{Function 4}$$

this function is another simplification of Function 2, and it can also lower the system complexity by eliminating $\cos(x)$ operation, and the recommended value of C is $\pi$.

Moreover, during the calculation of the phase matching degree $Q_l$ between $\tilde{\varphi}(i)$ and $\theta_l(i)$, for a[k-M], a[k-M+1], ..., a[k-1] with known demodulation results, only the $\theta_l(l)$ corresponding to the known demodulation results are employed for phase matching with the $\tilde{\varphi}(i)$.

For example, for M=1, when a[2] is demodulated, it requires to match the $\theta_l(i)$ and $\tilde{\varphi}(i)$ corresponding to all possible value combinations of a[1], a[2] and a[3]. If the demodulation result of a[1] is not used, for 2FSK/2GFSK, there are totally 8 value combinations for a[1], a[2] and a[3], thus $\tilde{\varphi}(i)$ needs to be matched with 8 phase matching vectors. If the demodulation result of a[1] that has been demodulated can be directly used, because a[1] is known, there are totally 4 value combinations for a[1], a[2] and a[3], and $\tilde{\varphi}(i)$ only needs to be matched with 4 phase matching vectors, thus computational complexity may be reduced.

Because the values of a[k−M], a[k−M+1], . . . , a[k−1] is already known, when the modulation mode is 2FSK/2GFSK, $\tilde{\varphi}(i)$ only needs to be matched with $2^{M+1}$ phase matching vectors among the $2^{2M+1}$ phase matching vectors; when the modulation mode is 4FSK/4GFSK, $\tilde{\varphi}(i)$ only needs to be matched with $4^{M+1}$ phase matching vectors among the $4^{2M+1}$ phase matching vectors.

For 2FSK/2GFSK and 4FSK/4GFSK, the digital information vector group $\{V_l(i)\}$ and the phase matching vector group $\{\theta_l(i)\}$ of a[k] may be determined by the method below:

for 2FSK/2GFSK, a[1], a[2], . . . , a[2M], a[2M+1] are taken as 1 or −1 respectively, $2^{2M+1}$ digital information vectors $V_l(i)$, l=1, 2, . . . , $2^{2M+1}$, are generated, and each digital information vector is substituted into $\theta(t,a)=2\pi h\Sigma_{k=-\infty}^{\infty}a[k]q(t-kT)$, then $\theta(t,a)$ is sampled by taking t=iT/N, i=1, 2, . . . , (2M+1)N to generate $2^{2M+1}$ phase matching vectors $\theta_l(i)$, wherein q(t) is the phase change of the FSK/GFSK baseband signal caused by each digital information over time;

for 4FSK/4GFSK, a[1], a[2], . . . , a[2M], a[2M+1] are taken as 3, 1, −1 or −3 respectively, $4^{2M+1}$ digital information vectors $V_l(i)$, l=1, 2, . . . , $4^{2M+1}$ are generated, and each digital information vector is substituted into $\theta(t,a)=2\pi h\Sigma_{k=-\infty}^{\infty}a[k]q(t-kT)$, and then $\theta(t,a)$ is sampled by taking t=iT/N, i=1, 2, . . . , (2M+1)N to generate $4^{2M+1}$ phase matching vectors $\theta_l(i)$, wherein q(t) is the phase change of the FSK/GFSK baseband signal caused by each digital information over time.

Specifically, the received FSK/GFSK baseband signal may be represented by the complex function below in the complex domain (I/Q plane):

$$r(t,a)=A\exp\{j2\pi h\Sigma_{k=-\infty}^{\infty}a[k]q(t-kT)+\varphi_0\}+n(t) \quad (1)$$

In formula (1), A is the magnitude of an FSK/GFSK baseband signal, h is frequency modulation index, a[k] is the digital information transmitted: when the modulation mode is 2FSK/2GFSK, a[k]∈{1,−1}; when the modulation mode is 4FSK/4FSK, a[k]∈{3, 1, −1, −3}. T is the period of each digital information, q(t) defines the phase change of the FSK/GFSK baseband signal caused by each digital information over time, $\varphi_o$ is the initial phase of the received FSK/GFSK baseband signal, and n(t) is the interference and noise during signal receiving. According to formula (1), in the phase domain, the received FSK/GFSK baseband signal may represent by:

$$\varphi(t,a)=2\pi h\Sigma_{k=-\infty}^{\infty}a[k]q(t-kT)+\varphi_0+\varphi_n(t) \quad (2)$$

In formula (2), $\psi_n(l)$ is the phase noise caused by the interference and noise.

Because the change of q(t) is often accomplished in the time exceeding one T, the technology of demodulating a[k] within the duration of only one T (no matter in complex domain or phase domain) has a poor performance due to the intersymbol crosstalk caused thereby. In the embodiment of the invention, a[k] is demodulated in the phase domain within the duration of a plurality of Ts by using the phase matching vector group according to the change time length of q(t).

The specific method will be described as follows:

It is determined according to the change time length of q(t) that a[k] will be demodulated within a duration of (2M+1)T. The longer M is, the better the performance will be, but the higher the demodulation complexity will be; and if it is implemented by hardware, the hardware cost will be improved correspondingly, and generally, M is 1 or 2.

A phase matching vector group is generated:

2FSK/2GFSK: a[1], a[2], . . . , a[2M], a[2M+1] are taken as 1 or −1 respectively, and $2^{2M+1}$ digital information vectors $V_l(i)$, l=1, 2, . . . , $2^{2M+1}$ are generated. Each digital information vector is substituted into the formula below:

$$\theta(t,a)=2\pi h\Sigma_{k=-\infty}^{\infty}a[k]q(t-kT) \quad (3)$$

Then, $\theta(t,a)$ is sampled by taking t=iT/N, i=1, 2, . . . , (2M+1)N to generate $2^{2M+1}$ phase matching vectors $\theta_l(i)$.

4FSK/4GFSK: a[1], a[2], . . . , a[2M], a[2M+1] are taken as 3, 1, −1 or −3 respectively, and $4^{2M+1}$ digital information vectors $V_l(i)$, l=1, 2, . . . , $4^{2M+1}$ are generated. Each digital information vector is substituted into formula (3), and then $\theta(t,a)$ is sampled by taking t=iT/N, i=1, 2, . . . , (2M+1)N to generate $4^{2M+1}$ phase matching vectors $\theta_l(i)$.

Demodulation Operation:

When a[k] is demodulated, the received FSK/GFSK baseband signal $\varphi(t,a)$ is sampled by taking t=(k−M)T+iT/N+$\varepsilon_o$, i=1, 2, . . . , (2M+1)N to obtain a received phase vector $\tilde{\varphi}(i)$, wherein $\varepsilon_o$ is the sampling time error, and the exact value thereof cannot be determined, but it can made that $$\varepsilon_0 \leq \frac{T}{2N}$$

via the common clock synchronization algorithm.

In order to lower the system complexity, when a[k] is demodulated, the demodulation result of a[k−M], a[k−M+1], . . . , a[k−1] will be employed to reduce the phase vectors to be matched. Because the values of a[k−M], a[k−M+1], . . . , a[k−1] are known, when the modulation mode is 2FSK/2GFSK, $\tilde{\varphi}(i)$ only needs to be matched with $2^{2M+1}$ phase matching vectors among the $2^{2M+1}$ phase matching vectors; and when the modulation mode is 4FSK/4GFSK, $\tilde{\varphi}(i)$ only needs to be matched with $4^{M+1}$ phase matching vectors among the $4^{2M+1}$ phase matching vectors.

In order to eliminate the adverse impact of the fixed phase difference caused by $\varphi_0$ and $\varepsilon_0$ on phase matching, the average phase difference between $\tilde{\varphi}(i)$ and $\theta_l(i)$ is calculated as follows:

$$\beta_l = \frac{1}{(2M+1)N} \sum_{i=1}^{(2M+1)N} \tilde{\varphi}(i) - \theta_l(i) \quad (4)$$

After the average phase difference $\beta_l$ is obtained, the phase matching degree between $\tilde{\varphi}(i)$ and $\theta_l(i)$ is calculated as follows:

$$Q_l = \Sigma_{i=1}^{(2M+1)N} f[\tilde{\varphi}(i) - \theta_l(i) - \beta_l] \quad (5)$$

In the above formula, is a function $f[x]$ for phase matching degree measurement, and when $f[x]$ employs the 4 functions below, the demodulation performance will be good.

$$f[x] = \cos(x) \quad (6)$$

$$f[x] = \begin{cases} \cos(x), & |x| < \pi \\ 1, & |x| > \pi \end{cases} \quad (7)$$

-continued $$f[x] = \begin{cases} -x^2, & |x| < C \\ -C^2, & |x| \geq C \end{cases} \quad (8)$$

$$f[x] = \begin{cases} -|x|, & |x| < C \\ -C, & |x| \geq C \end{cases} \quad (9)$$

l corresponding to $Q_l$ being the maximum is found in the $2^{M+1}$ (when the modulation mode is 2FSK/2GFSK) or the $4^{M+1}$ (when the modulation mode is 4FSK/4GFSK) phase matching calculation results, then the corresponding value of a[k] is found from the corresponding $V_l(l)$ according to l, and this value will be the demodulation result of a[k].

In the embodiment of the invention, a large number of complex multiplication, addition and subtraction operations are converted into real addition and subtraction operations during the phase domain demodulation of an FSK/GFSK signal, thus the system complexity of demodulation is greatly lowered. Moreover, in the embodiment of the invention, a phase matching vector group is employed for demodulation, the adverse impact of the fixed phase difference caused by $\psi_0$ and $\varepsilon_0$, etc., on phase matching is eliminated before demodulation, and a simple but effective function is designed to measure the phase matching degree, so that a demodulation performance close to that of the complex domain demodulation technology can be attained. Because the demodulation result of a[k-M], a[k-M+1], . . . , a[k-1] is employed when a[k] is demodulated, the phase vectors to be matched may be greatly reduced, thus the system complexity of demodulation using a phase matching vector group may be further lowered.

Figure 2:
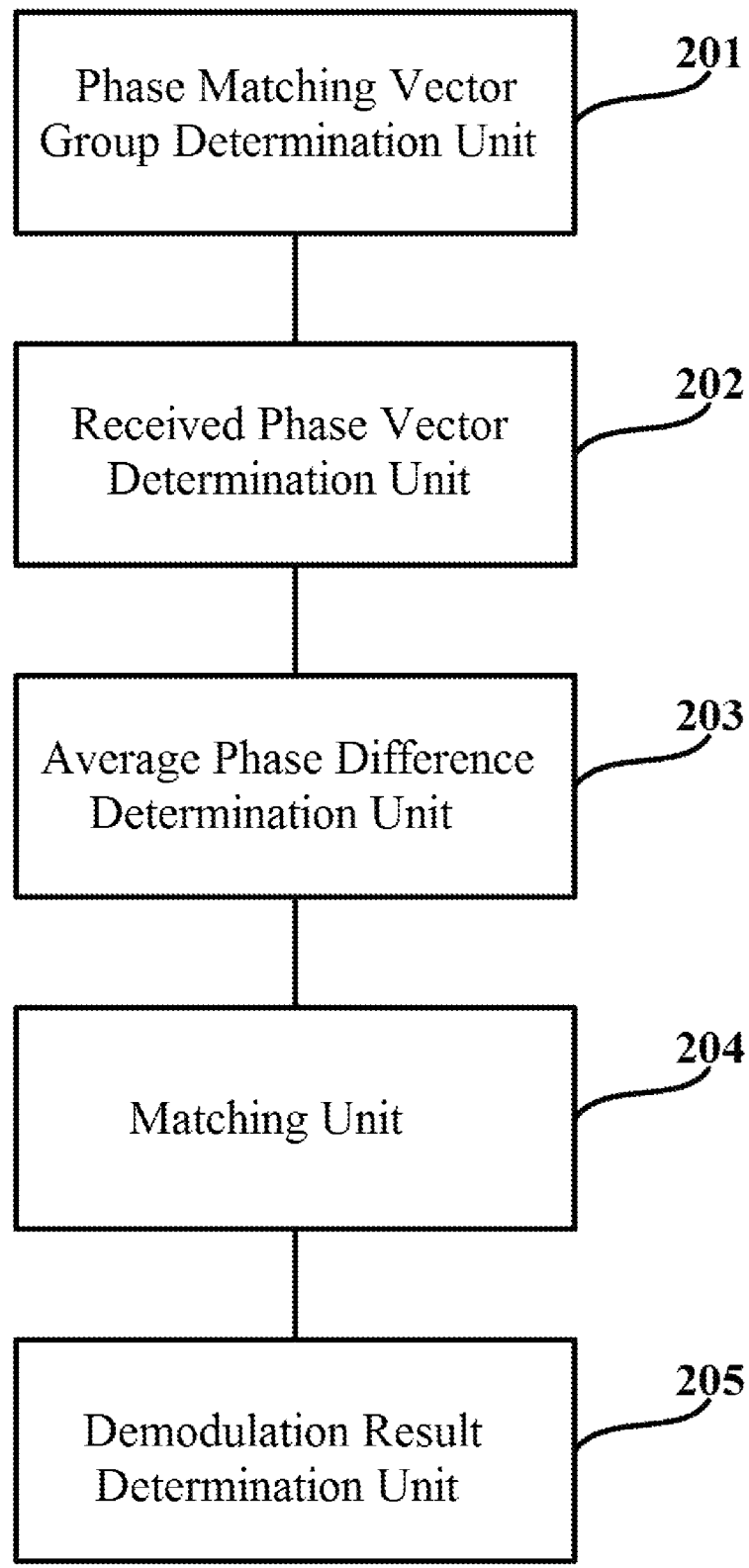
FIG. 2 is a structural representation of a device for FSK/GFSK demodulation according to an embodiment of the invention.

Correspondingly, embodiment of the invention further provides a device for FSK/GFSK demodulation. As shown in FIG. 2, the device for FSK/GFSK demodulation includes:

a phase matching vector group determination unit 201, configured to determine a digital information vector group $\{V_l(i)\}$ of a codeword a[k] to be demodulated and a corresponding phase matching vector group $\{\theta_l(i)\}$ within a duration of (2M+1)T, wherein M is an integer and M≥1, l is a phase matching vector number, and i is a sampling point number;

a received phase vector determination unit 202, configured to determine a received phase vector $\tilde{\varphi}(i)$ of the received FSK/GFSK baseband signal $\varphi(t,a)$;

an average phase difference determination unit 203, configured to determine an average phase difference $\beta_l$ between $\tilde{\varphi}(i)$ and $\theta_l(i)$;

a matching unit 204, configured to calculate a phase matching degree $Q_l$ between $\tilde{\varphi}(i)$ and $\theta_l(i)$ after removing the impact of the average phase difference $\beta_l$, and determine an l value corresponding to the phase matching degree $Q_l$ being the maximum; and a demodulation result determination unit 205, configured to determine the a[k], corresponding to the l value, in the digital information vector $V_l(i)$ as a demodulation result.

The device may be implemented by software, or be implemented by hardware, for example, an integrated circuit. When it is implemented by hardware, each unit will be implemented by a digital circuit.

For example, for the conversion of a complex domain into a phase domain, the phase value may be stored in an ROM, and the corresponding phase value may be obtained by taking the complex domain input as an address;

Operations such as addition and subtraction, multiplication and numeric comparison, etc., may be implemented via hardware such as an adder, a multiplier and a comparator, etc.;

Cos Operation: the cos operation result may be stored on a rom, and the corresponding cos value may be obtained by taking the phase input as an address;

Data storage may be implemented via a shift register.

It is well-known by one skilled in the art how to implement the function of each unit via a hardware circuit, and no repeated description will be given again here.

Moreover, the matching unit 204 is specifically configured to:

determine the phase matching degree as $Q_l = \sum_{i=1}^{(2M+1)N} f[\tilde{\varphi}(i) - \theta_l(i) - \beta_l]$, wherein N is the sampling times within time T, and $f[x]$ is a function for phase matching degree measurement; and determine an l value corresponding to the phase matching degree $Q_l$ being the maximum.

Further, $f[x]$ specifically is:

$$f[x] = \cos(x); \text{ or}$$

$$f[x] = \begin{cases} \cos(x), & |x| < \pi \\ 1, & |x| \geq \pi \end{cases} ; \text{ or}$$

$$f[x] = \begin{cases} -x^2, & |x| < C \\ -C^2, & |x| \geq C \end{cases},$$

wherein C is a given constant; or $$f[x] = \begin{cases} -|x|, & |x| < C \\ -C, & |x| \geq C \end{cases},$$

wherein C is a given constant.

Moreover, when the matching unit 204 calculates the phase matching degree $Q_l$ between $\tilde{\varphi}(i)$ and $\theta_l(i)$, for a[k-M], a[k-M+1], . . . , a[k-1] with known demodulation results, only the $\theta_l(i)$ corresponding to the known demodulation results are employed for phase matching with the $\tilde{\varphi}(i)$.

Moreover, the phase matching vector group determination unit 201 is specifically configured to:

for 2FSK/2GFSK, take a[1], a[2], . . . , a[2M], a[2M+1] as 1 or −1 respectively, generate $2^{2M+1}$ digital information vectors $V_l(i)$, l=1, 2, . . . , $2^{2M+1}$, and substitute each digital information vector into $\theta(t,a) = 2\pi h \sum_{k=-\infty}^{\infty} a[k]q(t-kT)$, and then sample $\theta(t,a)$ by taking t=iT/N, i=1, 2, . . . , (2M+1)N to generate $2^{2M+1}$ phase matching vectors $\theta_l(i)$, wherein q(t) is the phase change of the FSK/GFSK baseband signal caused by each digital information over time;

for 4FSK/4GFSK, take a[1], a[2], . . . , a[2M], a[2M+1] as 3, 1, −1 or −3 respectively, generate $4^{2M+1}$ digital information vectors $V_l(i)$, l=1, 2, . . . , $4^{2M+1}$, and substitute each digital information vector into $\theta(t,a) = 2\pi h \sum_{k=-\infty}^{\infty} a[k]q(t-kT)$, and then sample $\theta(t,a)$ by taking t=iT/N, i=1, 2, . . . , (2M+1)N to generate $4^{2M+1}$ phase matching vectors $\theta_l(i)$, wherein q(t) is the phase change of the FSK/GFSK baseband signal caused by each digital information over time.

Moreover, the average phase difference determination unit 203 is specifically configured to:
determine the average phase difference between and $\tilde{\varphi}(i)$ and $\theta_l(i)$ as $$\beta_l = \frac{1}{(2M+1)N} \sum_{i=1}^{(2M+1)N} \tilde{\varphi}(i) - \theta_i(i).$$

By the device, a large number of complex multiplication, addition and subtraction operations are converted into real addition and subtraction operations during the phase domain demodulation of an FSK/GFSK signal, thus the system complexity of demodulation is greatly lowered. Moreover, a phase matching vector group is employed for demodulation, the adverse impact of the fixed phase difference caused by $\varphi_0$ and $\varepsilon_0$ etc., on phase matching is eliminated before demodulation, and a simple but effective function is designed to measure the phase matching degree, so that a demodulation performance close to that of the complex domain demodulation technology can be attained. Because the demodulation result of a[k−M], a[k−M+1], . . . , a[k−1] is employed when a[k] is demodulated, the phase vectors to be matched may be greatly reduced, thus the system complexity of demodulation using a phase matching vector group may be further lowered.

The flow charts and block diagrams in the drawings show some systematic architectures, functions and operations that may be implemented by the methods, the devices and the computer-readable storage media according to various embodiments. It should be noted that, the step represented by each block in the flow chart may not be performed in the order shown by labels, sometimes, it may be performed in parallel, and sometimes, it may be performed in a reversed order, which is determined according to the functions concerned. It also needs to be noted that, each block in the block diagrams and/or the flow charts and a combination of the blocks in the block diagrams and/or the flow charts may be implemented by hardware for performing specific functions or operations, or may be implemented by a combination of hardware and computer instructions.

The units or modules concerned in the embodiments described in the invention may be implement by means of software, or hardware.

According to the above description of the embodiments, those skilled in the art may clearly understand that each embodiment may be implement with the aid of software plus necessary universal hardware platforms; of course, it may be implemented via hardware. Based on such an understanding, the essential part of the technical solutions in the embodiments of the invention, or in other words, the part that contributes to the prior art, may be embodied in the form of a software product that is stored in a computer-readable storage medium, for example, Read-Only Memory (ROM), Random-Access Memory (RAM), magnetic disc or compact disc, etc., and includes several instructions that can make a computer device (which may be a personal computer, a server or a network device, etc.) implement all or a part of the steps of the method according to each embodiment of the invention.

Finally, it should be noted that, the above embodiments are only provided for illustrating, rather than limiting, the technical solutions of the invention; although detailed illustration of the invention has being given referring to the above embodiments, it should be understood by one of ordinary skills in the art that modifications may be made on the technical solutions recorded in each of the above embodiment, or equivalent substitutions may be made on a part of the technical characteristics thereof, without departing from the spirit and scope of the technical solutions in each embodiment of the invention.

What is claimed is:

1. A method for FSK/GFSK demodulation, comprising:
   determining a digital information vector group ($V_l(i)$) of a codeword a[k] to be demodulated and a corresponding phase matching vector group ($\theta_l(i)$) within a duration of (2M+1)T, wherein M is an integer and M≥1, l is a phase matching vector number, i is a sampling point number, and T represents the period of each digital information;
   determining a received phase vector $\tilde{\varphi}(i)$ of a received FSK/GFSK baseband signal $\varphi(t,a)$;
   determining an average phase difference $\beta_l$ between $\tilde{\varphi}(i)$ and $\theta_l(i)$;
   calculating a phase matching degree $Q_l$ between $\tilde{\varphi}(i)$ and $\theta_l(i)$ after removing an impact of the average phase difference $\beta_l$, and determining an l value corresponding to the phase matching degree $Q_l$ being the maximum; and
   determining the a[k], corresponding to the l value, in the digital information vector $V_l(i)$ as a demodulation result.

2. The method according to claim 1, wherein, calculating a phase matching degree $Q_2$ between $\tilde{\varphi}(i)$ and $\theta_l(i)$ after removing an impact of the average phase difference $\beta_l$ and determining an l value corresponding to the phase matching degree $Q_l$ being the maximum comprises:
   determining the phase matching degree $Q_l$ as $Q_l=\Sigma_{i=1}^{(2M+1)N}f[\tilde{\varphi}(i)-\theta_l(i)-\beta_l]$, wherein N is sampling times within time T, and $f[x]$ is a function for phase matching degree measurement; and
   determining the l value corresponding to the phase matching degree $Q_l$ being the maximum.

3. The method according to claim 2, wherein, the $f[x]$ is:

$$f[x] = \cos(x); \text{ or}$$

$$f[x] = \begin{cases} \cos(x), & |x| < \pi \\ 1, & |x| \geq \pi \end{cases}; \text{ or}$$

$$f[x] = \begin{cases} -x^2, & |x| < C \\ -C^2, & |x| \geq C \end{cases},$$

wherein C is a given constant; or $$f[x] = \begin{cases} -|x|, & |x| < C \\ -C, & |x| \geq C \end{cases},$$

wherein C is a given constant.

4. The method according to claim 2, wherein, during the calculating of the phase matching degree $Q_l$ between $\tilde{\varphi}(i)$ and $\theta_l(i)$, for a[k−M], a[k−M+1], a[k−1] with known demodulation results, only the $\theta_l(i)$ corresponding to the known demodulation results are employed for phase matching with the $\tilde{\varphi}(i)$.

5. The method according to claim 1, wherein, determining a digital information vector group $\{V_l(i)\}$ of a codeword a[k] to be demodulated and a corresponding phase matching vector group {θ$_l$(i)} within a duration of (2M+1)T comprises:

for 2FSK/2GFSK, taking a[1], a[2], ..., a[2M], a[2M+1] as 1 or −1 respectively, generating $2^{2M+1}$ digital information vectors V$_l$(i), l=1, 2, ... $2^{2M+1}$, and substituting each digital information vector into θ(t,a)=2πhΣ$_{k=-\infty}^{\infty}$a[k] q(t−kT), and then sampling θ(t,a) by taking t=iT/N, i=1, 2, ..., (2M+1)N to generate $2^{2M+1}$ phase matching vectors θ$_l$(i), wherein q(t) is a phase change of the FSK/GFSK baseband signal caused by each digital information over time;

for 4FSK/4GFSK, taking a[1], a[2], ..., a[2M], a[2M+1] as 3, 1, −1 or −3 respectively, generating $4^{2M+1}$ digital information vectors V$_l$(i), l=1, 2, ..., $4^{2M+1}$, and substituting each digital information vector into θ(t,a)=2πhΣ$_{k=-\infty}^{\infty}$a[k] q(t−kT), and then sampling θ(t, a) by taking t=iT/N, i=1, 2, ... (2M+1)N to generate $4^{2M+1}$ phase matching vectors θ$_l$(i), wherein q(t) is a phase change of the FSK/GFSK baseband signal caused by each digital information over time.

6. The method according to claim 1, wherein, determining an average phase difference β$_l$ between $\tilde{\varphi}$(i) and θ$_l$(i) comprises:

determining an average phase difference between $\tilde{\varphi}$(i) and θ$_l$(i) as $$\beta_l = \frac{1}{(2M+1)} \sum_{i=1}^{(2M+1)N} \tilde{\varphi}(i) - \theta_l(i).$$

7. A device for FSK/GFSK demodulation, comprising:

a phase matching vector group determination unit, configured to determine a digital information vector group {V$_l$(i)} of a codeword a[k] to be demodulated and a corresponding phase matching vector group {θ$_l$(i)} within a duration of (2M+1)T, wherein M is an integer and M≥1, l is a phase matching vector number, i is a sampling point number, and T represents the period of each digital information;

a received phase vector determination unit, configured to determine a received phase vector $\tilde{\varphi}$(i) of a received FSK/GFSK baseband signal φ(t,a);

an average phase difference determination unit, configured to determine an average phase difference β$_l$ between $\tilde{\varphi}$(i) and θ$_l$(i);

a matching unit, configured to calculate a phase matching degree Q$_l$ between $\tilde{\varphi}$(i) and θ$_l$(i) after removing an impact of the average phase difference β$_l$, and determining an l value corresponding to the phase matching degree Q$_l$ being the maximum; and a demodulation result determination unit, configured to determine the a[k], corresponding to the l value, in the digital information vector V$_l$(i) as a demodulation result.

8. The device according to claim 7, wherein, the matching unit is configured to:

determine the phase matching degree as Q$_l$=Σ$_{i=1}^{(2M+1)N}$ƒ[$\tilde{\varphi}$(i)−θ$_l$(i)−β$_l$], wherein N is sampling times within time T, and ƒ[x] is a function for phase matching degree measurement; and determine an l value corresponding to the phase matching degree Q$_l$ being the maximum.

9. The device according to claim 8, wherein, the ƒ[x] is:

$$f[x] = \cos(x); \text{ or}$$

$$f[x] = \begin{cases} \cos(x), & |x| < \pi \\ 1, & |x| \geq \pi \end{cases}; \text{ or}$$

$$f[x] = \begin{cases} -x^2, & |x| < C \\ -C^2, & |x| \geq C \end{cases},$$

wherein C is a given constant; or $$f[x] = \begin{cases} -|x|, & |x| < C \\ -C, & |x| \geq C \end{cases},$$

wherein C is a given constant.

10. The device according to claim 8, wherein, when the matching unit calculates the phase matching degree Q$_l$ between $\tilde{\varphi}$(i) and θ$_l$(i), for a[k−M], a[k−M+1], a[k−1] with known demodulation results, only the θ$_l$(i) corresponding to the known demodulation results are employed for phase matching with the $\tilde{\varphi}$(i).

11. The device according to claim 7, wherein, the phase matching vector group determination unit is configured to:

for 2FSK/2GFSK, take a[1], a[2], ..., a[2M], a[2M+1] as 1 or −1 respectively, generate $2^{2M+1}$ digital information vectors V$_l$(i), l=1, 2, ... $2^{2M+1}$, and substitute each digital information vector into θ(t,a)=2πhΣ$_{k=-\infty}^{\infty}$a[k] q(t−kT), and then sample θ(t,a) by taking t=iT/N, i=1, 2, ..., (2M+1)N to generate $2^{2M+1}$ phase matching vectors θ$_l$(i), wherein q(t) is a phase change of the FSK/GFSK baseband signal caused by each digital information over time;

for 4FSK/4GFSK, take a[1], a[2], ..., a[2M], a[2M+1] as 3, 1, −1 or −3 respectively, generate $4^{2M+1}$ digital information vectors V$_l$(i), l=1, 2, ..., $4^{2M+1}$, and substitute each digital information vector into θ(t,a)=2πhΣ$_{k=-\infty}^{\infty}$a[k] q(t−kT), and then sample θ(t,a) by taking t=iT/N, i=1, 2, ... (2M+1)N to generate $4^{2M+1}$ phase matching vectors θ$_l$(i), wherein q(t) is a phase change of the FSK/GFSK baseband signal caused by each digital information over time.

12. The device according to claim 7, wherein, the average phase difference determination unit is configured to:

determine an average phase difference between $\tilde{\varphi}$(i) and θ$_l$(i) as $$\beta_l = \frac{1}{(2M+1)N} \sum_{i=1}^{(2M+1)N} \tilde{\varphi}(i) - \theta_l(i).$$

* * * * *